(12) United States Patent
Miyake et al.

(10) Patent No.: US 9,252,387 B2
(45) Date of Patent: Feb. 2, 2016

(54) ILLUMINATION DEVICE HAVING LIGHT-TRANSMITTING RESIN DEFINING APPEARANCE OF ILLUMINATION DEVICE

(71) Applicant: Panasonic Corporation, Osaka (JP)

(72) Inventors: Yoshiyuki Miyake, Osake (JP); Kayo Nojiri, Osaka (JP); Kazuya Sudo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/795,475

(22) Filed: Mar. 12, 2013

(65) Prior Publication Data

US 2013/0256635 A1 Oct. 3, 2013

(30) Foreign Application Priority Data

Mar. 30, 2012 (JP) ................................. 2012-081069

(51) Int. Cl.
| | |
|---|---|
| *H01L 51/52* | (2006.01) |
| *F21V 31/04* | (2006.01) |
| *H05B 33/08* | (2006.01) |
| *H05B 33/22* | (2006.01) |
| *F21Y 105/00* | (2006.01) |

(52) U.S. Cl.
CPC ............ *H01L 51/5237* (2013.01); *F21V 31/04* (2013.01); *H01L 51/5253* (2013.01); *H01L 51/5275* (2013.01); *H05B 33/0803* (2013.01); *H05B 33/0896* (2013.01); *H05B 33/22* (2013.01); *F21Y 2105/00* (2013.01); *F21Y 2105/008* (2013.01); *H01L 2251/5361* (2013.01)

(58) Field of Classification Search
CPC ................. H01L 33/54; H01L 25/167; H01L 2924/1815; H01L 31/0203; H01L 51/5234; H01L 51/5253; H01L 1/5262; G02B 19/0061; G02B 3/04; F21V 15/01; F21V 31/00
USPC .................... 257/95, E33.059, 100, E33.074, 257/E31.127, 687, 690, 730; 438/29; 362/335, 612
See application file for complete search history.

(56) References Cited

U.S. PATENT DOCUMENTS

| | | | |
|---|---|---|---|
| 3,317,722 A | 5/1967 | Whitney | |
| 6,340,824 B1 * | 1/2002 | Komoto et al. | 257/99 |

(Continued)

FOREIGN PATENT DOCUMENTS

| | | |
|---|---|---|
| CN | 101351064 A | 1/2009 |
| CN | 201836734 U | 5/2011 |

(Continued)

OTHER PUBLICATIONS

European Search Report for corresponding European Application No. 13001339.4 dated Oct. 4, 2013.

(Continued)

*Primary Examiner* — Marcos D Pizarro
(74) *Attorney, Agent, or Firm* — Renner, Otto, Boisselle & Sklar, LLP (57) ABSTRACT

An illumination device includes a light-emitting element, a wire connected to the light-emitting element to supply electric power to the light-emitting element, and a light-transmitting resin configured to hold the light-emitting element and the wire in one piece. The light-transmitting resin defines an appearance of the illumination device. Light emitted from the light-emitting element is transmitted through the light-transmitting resin to be radiated from an outer surface of the light-transmitting resin.

13 Claims, 13 Drawing Sheets

(56) References Cited

U.S. PATENT DOCUMENTS

| | | | |
|---|---|---|---|
| 2008/0165539 A1* | 7/2008 | Hsu et al. | 362/309 |
| 2008/0180936 A1 | 7/2008 | Ogashiwa | |
| 2008/0266869 A1 | 10/2008 | Tai et al. | |
| 2009/0021155 A1 | 1/2009 | Oda | |
| 2009/0270526 A1 | 10/2009 | Liu et al. | |
| 2011/0166246 A1* | 7/2011 | Liu et al. | 522/66 |
| 2012/0114415 A1 | 5/2012 | Blocken et al. | |

FOREIGN PATENT DOCUMENTS

| | | |
|---|---|---|
| DE | 102 39 008 | 3/2004 |
| DE | 20 2010 002 772 U | 8/2010 |
| EP | 1 906 079 | 4/2008 |
| JP | 2008-186559 | 8/2008 |
| JP | 2008-186599 | 8/2008 |
| JP | 2011-119402 | 6/2011 |
| TW | 200945516 A1 | 11/2009 |
| WO | 2011/003866 | 1/2011 |

OTHER PUBLICATIONS

Chinese Office Action dated Apr. 3, 2015, including Search Report, issued in corresponding Chinese application No. 201310106630.2 and English translation thereof.

* cited by examiner

ILLUMINATION DEVICE HAVING LIGHT-TRANSMITTING RESIN DEFINING APPEARANCE OF ILLUMINATION DEVICE

FIELD OF THE INVENTION

The present invention relates to an illumination device in which a light-emitting element is held by a light-transmitting resin.

BACKGROUND OF THE INVENTION

In an electroluminescence (EL) element, a light-emitting unit, including a light-emitting layer sandwiched by a positive electrode and a negative electrode, is formed on a transparent substrate. Upon applying a voltage between the electrodes, the EL element emits light as excitons are generated by the recombination of positive holes and electrons injected into the light-emitting layer as carriers.

EL elements are largely divided into an organic EL element, in which an organic material is used as a fluorescent material of a light-emitting layer, and an inorganic EL element, in which an inorganic material is used as a fluorescent material of a light-emitting layer. In particular, the organic EL element is capable of emitting high-brightness light at a low voltage. The organic EL element has characteristics that can obtain different emission colors depending on the kind of fluorescent materials and can be easily manufactured as a surface light-emitting body.

As an example of illumination devices using the characteristics of the EL element as a surface light-emitting body, there is known an illumination device in which sub-panels are rotatably connected to the respective sides of a rectangular organic EL panel having the same shape as the sub-panels (see, e.g., Japanese Patent Application Publication No. 2008-186599). By rotating the sub-panels, the illumination device can be transformed into a desired shape, e.g., a flat shape or a box shape. This makes it possible to improve the design merit of the illumination device.

The illumination device disclosed in JP2008-186599A includes an EL panel in which a light-emitting element (organic EL element) is accommodated within a case with the light-emitting surface thereof exposed to the outside and a connecting portion for supporting the EL panel. For this reason, the appearance of the illumination device is defined by the case and the connecting portion. Thus, the shape of the light-emitting element does not contribute to the design merit of the illumination device as a whole.

SUMMARY OF THE INVENTION

In view of the above, the present invention provides an illumination device capable of taking advantage of the shape characteristics of a light-emitting element and increasing the design merit.

In accordance with an aspect of the present invention, there is provided an illumination device including: a light-emitting element; a wire connected to the light-emitting element to supply electric power to the light-emitting element; and a light-transmitting resin configured to hold the light-emitting element and the wire in one piece, wherein the light-transmitting resin defines an appearance of the illumination device, light emitted from the light-emitting element being transmitted through the light-transmitting resin to be radiated from an outer surface of the light-transmitting resin.

A portion of the outer surface of the light-transmitting resin may be subjected to frost processing.

The light-transmitting resin may include a light distribution control surface for controlling distribution of the light projected from the outer surface of the light-transmitting resin.

The light-emitting element may be a planar organic electroluminescence element that includes an organic layer including an organic emission layer, an anode layer provided on one surface of the organic layer, a cathode layer provided on the other surface of the organic layer, and a substrate on which the organic layer, the anode layer, and the cathode layer are deposited one above another.

The light-transmitting resin may have a polyhedral shape, the light-emitting element having a flat shape and being held by the light-transmitting resin in a state where the light-emitting element remains parallel to one surface of the light-transmitting resin defining an appearance of the light-transmitting resin.

The light-transmitting resin may have a rectangular parallelepiped shaped, the light-emitting element having a flat shape and being held by the light-transmitting resin in a state where the light-emitting element is inclined at a specified angle with respect to one surface of the light-transmitting resin defining the appearance of the light-transmitting resin.

The light-transmitting resin may have rounded corner portions.

The wire may be held by the light-transmitting resin in a state in which a portion of the wire remains parallel to one side of the appearance of the light-transmitting resin.

The light-transmitting resin may have a substantially spherical shape.

The anode layer and the cathode layer may have a light-transmitting property.

The light-emitting element may include a plurality of light-emitting elements.

According to the present invention, the light-transmitting resin which holds the light-emitting element defines the appearance of the illumination device. Thus, the light-emitting element as a light source is seen as if it floats within the light-transmitting resin. This makes it possible to take advantage of the shape characteristics of the light-emitting element and obtain an increased design merit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

An illumination device according to one embodiment of the present invention will now be described with reference to FIGS. 1 to 6C. As shown in FIGS. 1 and 2A to 2C, the illumination device 1 of the present embodiment includes a light-emitting element 2, wires 3 connected to the light-emitting element 2 to supply electric power to the light-emitting element 2, and a light-transmitting resin 4 for holding the light-emitting element 2 and the wires 3 in one piece. The light-transmitting resin 4 defines the appearance of the illumination device 1. The light-transmitting resin 4 guides the light emitted from the light-emitting element 2 and projects the light from the outer surface thereof. The illumination device 1 of the present embodiment may be used as an interior stand to be placed on a shelf or a table.

The light-transmitting resin 4 has a polyhedral shape (a substantially parallelepiped shape in the present embodiment). The light-transmitting resin 4 is formed such that two opposing surfaces thereof (referred to as "front surface 41" and "rear surface 42" for the sake of description) have a substantially square shape and a top surface 43, a pair of side surfaces 44, and a bottom surface 45 thereof, which interconnect the front surface 41 and the rear surface 42, become smaller in size than one side of the front surface 41 or the rear surface 42. The corner portions between the top surface 43 and the side surfaces 44 and the corner portions between the side surfaces 44 and the bottom surface 45 are rounded. The light-emitting element 2 is a substantially-rectangular organic EL element having a flat emission surface. The light-emitting element 2 is arranged parallel to the bottom surface 45 defining the appearance of the light-transmitting resin 4 and is held such that the emission surface thereof faces toward the top surface 43. The light-emitting element 2 is held substantially at the center of the light-transmitting resin 4 in the width direction of the light-transmitting resin 4 and is held in a position nearer to the bottom surface 45 than to the top surface 43 in the height direction of the light-transmitting resin 4. The front surface dimension of the light-transmitting resin 4 is set larger than, preferably 2 to 4 times larger than, the length of the long side of the light-emitting element 2. Depending on the emission output of the light-emitting element 2, the width dimension of the light-transmitting resin 4 is preferably set larger than the length of the short side of the light-emitting element 2.

The wires 3 are held by the light-transmitting resin 4 in such a state where the wires 3 extend in a specified distance from the end portion of the light-emitting element 2 in a direction parallel to the bottom surface 45, and the tip end portions thereof are bent toward the corner portion between one of the side surfaces 44 and the bottom surface 45. The ends of the wires 3, opposite to the end portions thereof connected to the light-emitting element 2, are exposed from the light-transmitting resin 4. Metal wires superior in electric conductivity, such as copper wires or the like, are used as the wires 3. The wires 3 are not covered with insulating resins or the like.

Figure 1:
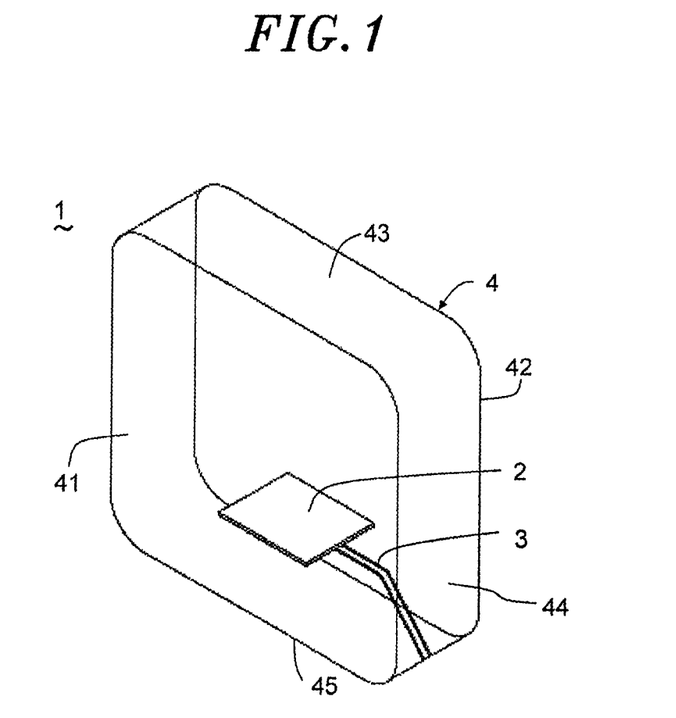
FIG. 1 is a perspective view of an illumination device according to one embodiment of the present invention.
Figure 2A:
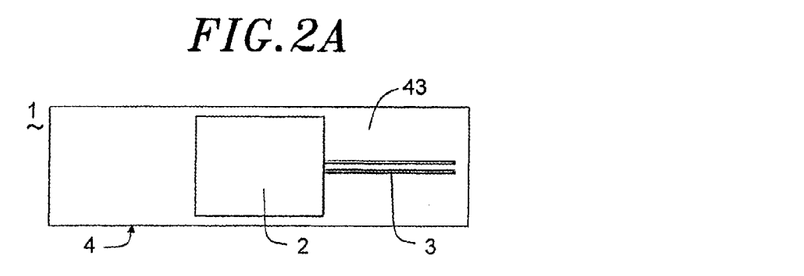
FIGS. 2A, 2B, and 2C are respectively plan, front, and side views of the illumination device.
Figure 2B:
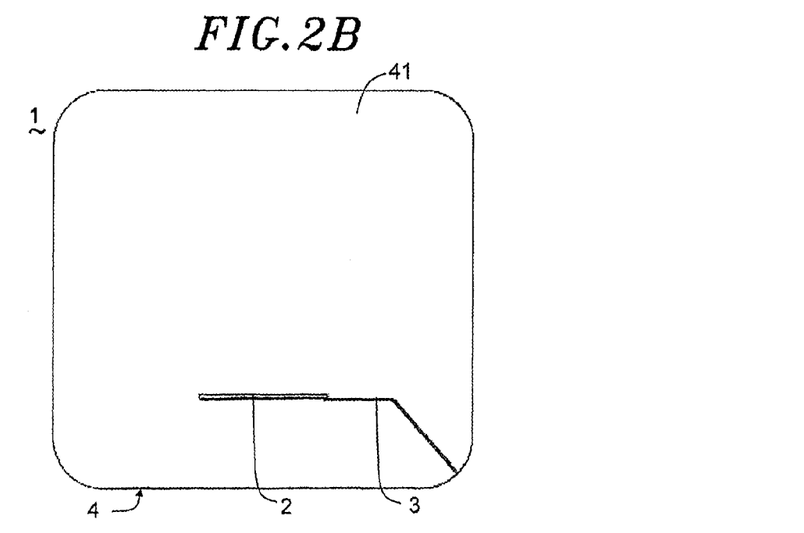
Figure 2C:
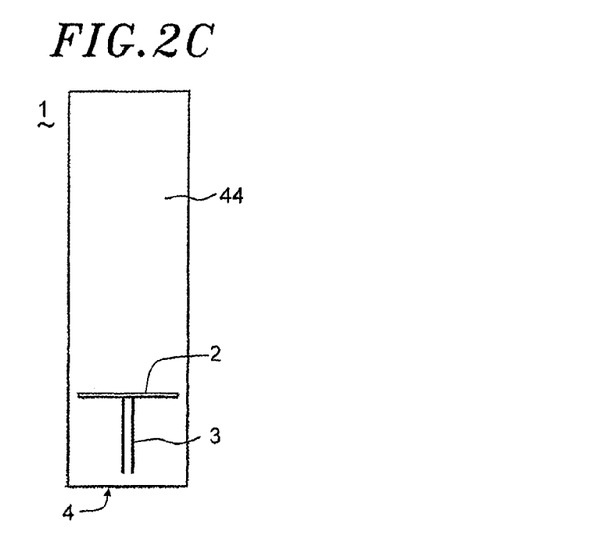
Figure 3:
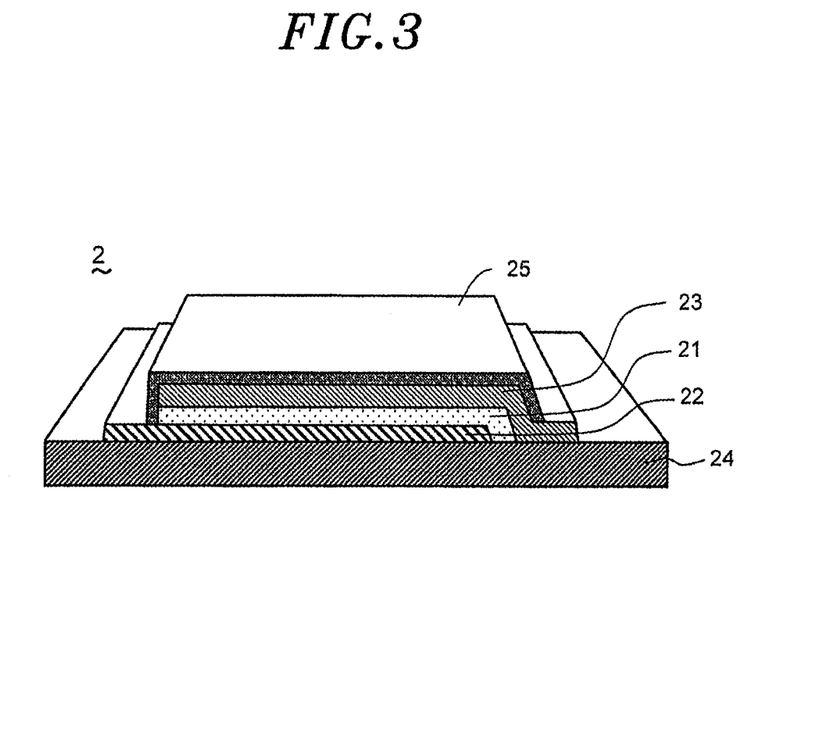
FIG. 3 is a side section view showing the schematic configuration of an EL element for use in the illumination device.

As shown in FIG. 3, the light-emitting element 2 is a planar organic EL element that includes an organic layer 21 including an organic emission layer, an anode layer 22 provided on one surface of the organic layer 21, a cathode layer 23 provided on the other surface of the organic layer and a substrate 24 on which the anode layer 22, the organic layer 21, and the cathode layer 23 are stacked one above another. The organic layer 21, the anode layer 22, and the cathode layer 23 are covered with a seal material 25 such as an epoxy resin or the like, with the exception of the electrode lead-out portions (not shown) thereof. A copper foil may be coated on a top surface of the seal material 25. The wires 3 are electrically connected to the electrode lead-out portions.

The organic layer 21 includes an emission layer containing an organic emission material, electron injecting layers for injecting electrons and transport layers for transporting positive holes or electrons to the electron injecting layers. An organic fluorescent material capable of emitting desired white light is used as the emission layer. The emission layer is made of, e.g., a compound whose molecular structure has radicals consisting of anthracene, naphthalene, pyrene, tetracene, coronene, perylene, phthaloperylene, naphthaloperylene, diphenyl butadiene, tetraphenyl butadiene, coumarin, oxadiazole, bisbenzoxazoline, bisstyryl, cyclopentadiene, quinoline metal complex, tris(8-hydroxyquinolinate) aluminum complex, tris(4-methyl-8-quinolinate) aluminum complex, tris(5-penyl-8-quinolinate) aluminum complex, aminoquinoline metal complex, benzoquinoline metal complex, tri-(p-terphenyl-4-yl)amine, 1-aryl-2,5-di(2-thienyl)pyrrole derivative, pyran, quinacridone, rubrene, distyrylbenzene derivative, distyrylarylene derivative, or a light-emitting compound thereof, polymers, mixtures of various fluorescent dyes, or the like.

The organic layer 21 is formed by depositing organic materials making up the aforementioned layers on the surface of the anode layer 22 by, e.g., a vacuum deposition method, and then patterning the same. The respective layers making up the organic layer 21 may be formed by mixing different materials and/or depositing them. For example, a buffer layer for adjusting an electric potential may be interposed between the respective layers.

The anode layer 22 is an electrode for injecting positive holes into the organic layer 21 and is made of an electrode material including a metal having a large work function, an alloy, an electrically conductive compound, or a mixture thereof. In particular, the anode layer 22 is preferably made of a light-transmitting electrically-conductive material such as ITO, $SnO_2$ (tin oxide), or ZnO (zinc oxide). The anode layer 22 is formed by depositing these electrode materials on the surface of the substrate 24 by, e.g., a vacuum deposition method or a sputtering method, and then patterning the same.

The cathode layer 23 is an electrode for injecting electrons into the organic layer 21 and is made of an electrode material including a metal having a small work function, an alloy, an electrically conductive compound, or a mixture thereof. In particular, the cathode layer 23 is preferably made of a light-reflecting electrically-conductive material such as lithium, aluminum, aluminum-lithium alloy, a magnesium-silver mixture, an $Al—Al_2O_3$ mixture, or an Al—LiF mixture. The cathode layer 23 is formed by the same method as used in forming the anode layer 22. In the present embodiment, the light-emitting element 2 has the configuration in which the anode layer 22 has a light-transmitting property, the cathode layer 23 has a light-reflecting property and light is emitted from one surface of the light-emitting element 2. Alternatively, the light-emitting element 2 may have a configuration in which the anode layer 22 and the cathode layer 23 have a light-transmitting property and light is emitted from the opposite surfaces of the light-emitting element 2. The single-surface-light-emitting organic EL element is desirably used in the illumination device 1 which is placed on a shelf or a table and which is configured to irradiate light toward the top surface 43 of the light-transmitting resin 4. On the other hand, the double-surface-light-emitting organic EL element is desirably used in, e.g., a ceiling-suspended or wall-hung illumination device 1 that irradiates light towards the surrounding surfaces in all directions.

The substrate 24 is made of a light-transmitting glass, such as a soda-lime glass or a non-alkali glass, or a light-transmitting resin material and is formed into, e.g., a substantially rectangular shape. A light extraction film having minute irregularities is formed on the light projection surface of the substrate 24 in order to improve the extraction efficiency of light from the substrate 24. The substrate 24 may be made of a flexible material.

Figure 4A:
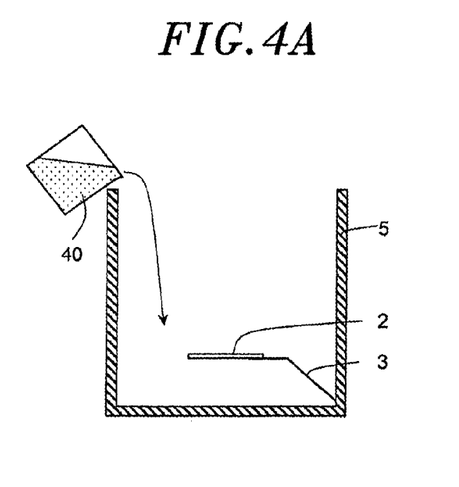
FIGS. 4A to 4D are front views for explaining a manufacturing sequence of the illumination device.
Figure 4B:
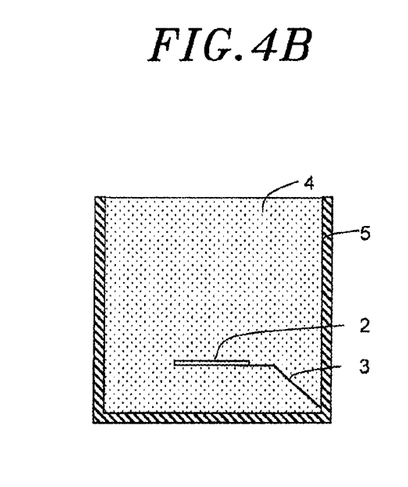
Figure 4C:
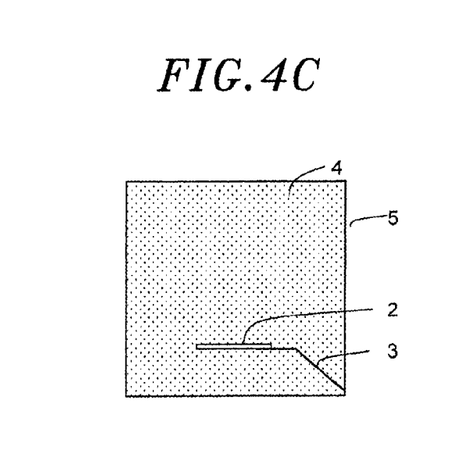

Next, a manufacturing sequence of the illumination device 1 will be described with reference to FIGS. 4A to 4D. As shown in FIG. 4A, a transparent material 40 making up the light-transmitting resin 4 is poured into a box-shaped frame body 5 (e.g., a mold) in a state where the light-emitting element 2 and the wires 3 are fixed in place. In order not to impair the properties of an organic material of the organic layer 21, a transparent resin, e.g., an acryl resin or a polystyrene resin, having a melting point of 100° C. or less and being cured at room temperature, is desirably used as the transparent material 40. Next, as shown in FIGS. 4B and 4C, the transparent material 40 filled in the frame body 5 is completely cured and then the cured light-transmitting resin 4 is taken out from the frame body 5. Thus, the light-emitting element 2 and the wires 3 are encapsulated by the light-transmitting resin 4. This manufacturing sequence is desirably used in a case where the wires 3 have strength enough to hold the light-emitting element 2 in a specified height position. As compared with the manufacturing sequence to be later described, it is possible to obtain a seamless clear light-transmitting resin 4.

Figure 4D:
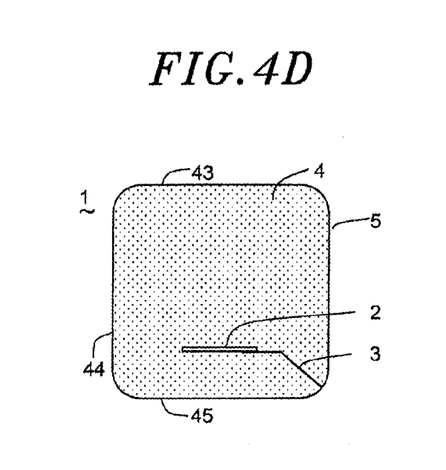

As shown in FIG. 4D, the corner portions between the top surface 43 and the side surfaces 44 and the corner portions between the side surfaces 44 and the bottom surface 45 are rounded by a cutting work. When the corner portions between the side surfaces 44 and the bottom surface 45 are cut away, some portions of the wires 3 extending towards one of the corner portions are also cut away together with the resin. Since the wires 3 are not covered with an insulating resin or the like, the power-supply ends of the wires 3 are exposed from the light-transmitting resin 4 by the cutting work. Further, the top surface 43, the side surfaces 44, and the bottom surface 45 are subjected to frost processing. Unless polished, the rounded surfaces of the corner portions naturally become frost surfaces. The light-transmitting resin 4 formed in the aforementioned sequence defines the appearance of the illumination device 1. Lead wires (not shown) are joined to the power-supply ends of the wires 3 by solders or the like. The lead wires are connected to a circuit board and a power supply circuit for lighting the light-emitting element 2.

Figure 5A:
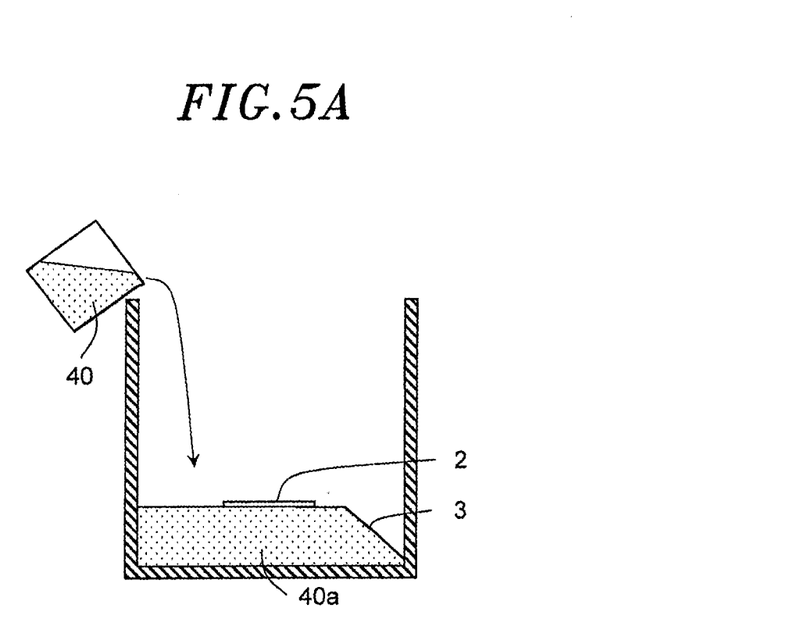
FIGS. 5A and 5B are front views for explaining another example of the manufacturing sequence of the illumination device.
Figure 5B:
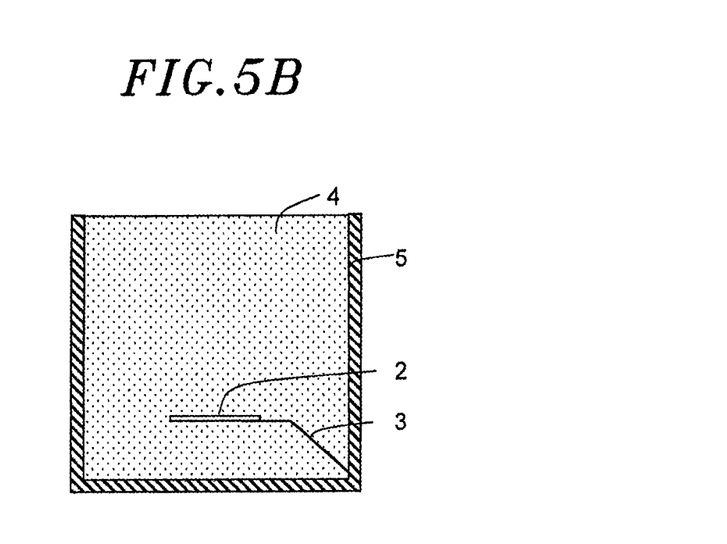

Next, another example of the manufacturing sequence of the illumination device 1 will be described with reference to FIGS. 5A and 5B and FIGS. 4C and 4D. In this manufacturing sequence, as shown in FIG. 5A, a light-transmitting resin member 40*a* formed into a specified trapezoidal shape is arranged within a frame body 5. The light-emitting element 2 is arranged on the upper surface portion of the resin member 40*a*. The wires 3 are arranged on the slant surface portion of the resin member 40*a*. In this state, a transparent material 40 is filled in the frame body 5. The resin member 40*a* is made of the same resin material as the transparent material 40 or a resin material substantially identical in refractive index with the transparent material 40. The transparent material 40, when cured, is unified with the resin member 40*a*. Thus, as shown in FIG. 5B, it is possible to obtain a light-transmitting resin 4. The subsequent steps are the same as the steps described with reference to FIGS. 4C and 4D. This manufacturing sequence is desirably used in a case where the strength of the wires 3 is not enough to hold the light-emitting element 2.

Figure 6A:
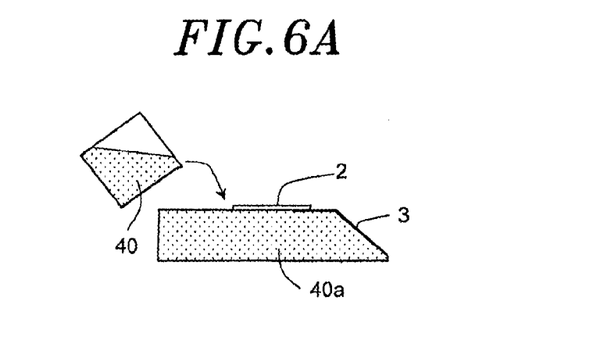
FIGS. 6A to 6C are front views for explaining a further example of the manufacturing sequence of the illumination device.
Figure 6B:
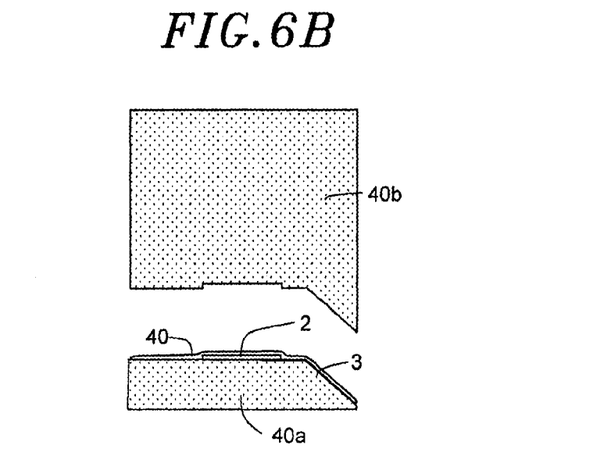
Figure 6C:
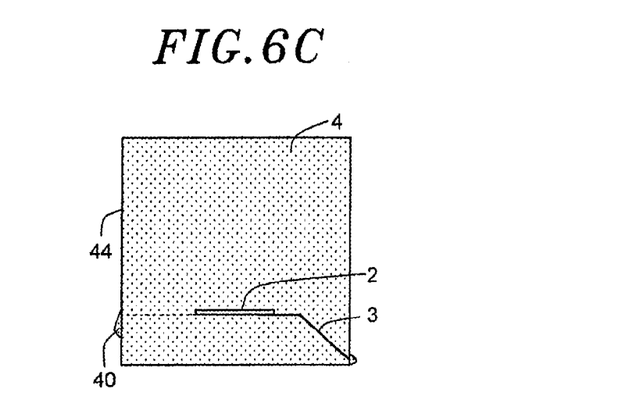

Next, a further example of the manufacturing sequence of the illumination device 1 will be described with reference to FIGS. 6A to 6C and FIG. 4D. In this manufacturing sequence, as shown in FIG. 6A, a light-transmitting resin member 40*a* formed into a specified trapezoidal shape is prepared as in the aforementioned manufacturing sequence. The light-emitting element 2 is arranged on the upper surface portion of the resin member 40*a*. The wires 3 are arranged on the slant surface portion of the resin member 40*a*. Then, as shown in FIG. 6B, a transparent material 40 is applied on the light-emitting element 2, the wires 3, and the resin member 40*a*. Next, a resin member 40*b*, having a surface complementary to the corresponding surface of the resin member 40*a* on which the light-emitting element 2 and the wires 3 are arranged, is prepared. The resin members 40*a* and 40*b* are joined together by using the transparent material 40 as a binder. As shown in FIG. 6C, the transparent material 40 flowing along the side surfaces 44 is removed during the cutting work of the corner portions or during the frost processing. The subsequent steps are the same as the steps described with reference to FIG. 4D. This manufacturing sequence is desirably used in a case where the substrate 24 of the light-emitting element 2 is made of a hard material and is easily cracked by the stress change during the curing process of the transparent material 40.

In the illumination device 1 as configured above, light is emitted from the light-emitting element 2 if electric power is supplied to the light-emitting element 2 through the wires 3. The light emitted from the light-emitting element 2 is transmitted through the light-transmitting resin 4. The light transmitted through the light-transmitting resin 4 is incident on the interior surface of the light-transmitting resin 4. The light, whose incidence angle with respect to the interior surface is smaller than a critical angle, is projected outward from the light-transmitting resin 4. The light, whose incidence angle with respect to the interior surface is larger than the critical angle, is totally reflected and is transmitted through the light-transmitting resin 4. Since the top surface 43, the side surfaces 44, the bottom surface 45, and the rounded corner portions are subjected to the frost processing, the light is more easily projected therethrough than through the front surface 41 and the rear surface 42. As a result, upon lighting the light-emitting element 2, the light is radiated from the top surface 43, the side surfaces 44, and the bottom surface 45. Therefore, the illumination device 1 can perform fantastic illumination by which light is radiated from a transparent object. When observed from the front surface 41 and the rear surface 42, the light-emitting element 2 as a light source is seen as if it floats within the light-transmitting resin 4. It is therefore possible to take advantage of the shape characteristic of the light-emitting element 2 and to obtain an enhanced design merit.

In the illumination device 1, the wires 1 are held by the light-transmitting resin 4 in a state that some portions of the wires 1 remain parallel to one side of the light-transmitting resin. In other words, the wires 3 are linearly arranged within the light-transmitting resin 4, thereby giving a stylish design to the illumination device 1. In the illumination device 1, the light-emitting element 2 and the wires 3 are kept encapsulated by the light-transmitting resin 4. Thus, the sealing performance of the light-emitting element 2 grows higher. In particular, as shown in FIG. 4D, if the ends of the wires 3 are exposed by cutting the corner portions of the light-transmitting resin 4, there is little possibility of water or air infiltration into the light-emitting element 2 through the wiring portions of the wires 3. Therefore, the illumination device can be submerged in water and can perform illumination which was unavailable in the past.

Figure 7A:
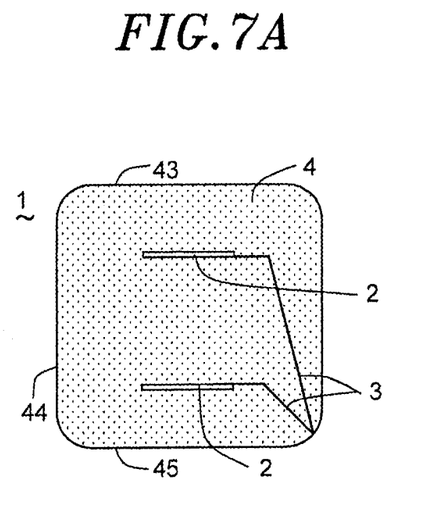
FIGS. 7A and 7B are respectively front and side views of an illumination device according to one modified example of the embodiment.
Figure 7B:
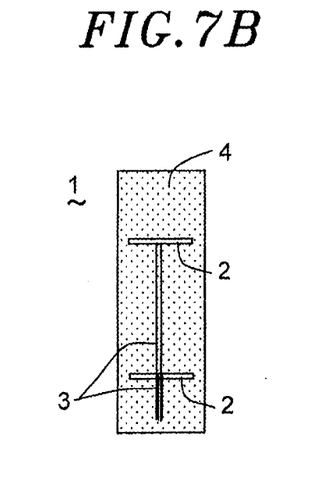

Next, an illumination device according to one modified example of the foregoing embodiment will be described with reference to FIGS. 7A and 7B. The illumination device 1 according to this modified example includes a plurality of (two, in this modified example) light-emitting elements 2. It is preferred that the emission surfaces of the light-emitting elements 2 be arranged to face towards the opposite sides from each other. With this modified example, the use of a plurality of light-emitting elements 2 makes it possible to inhibit the reduction of brightness of the light projected from the outer surface of the illumination device 1, even when the illumination device 1 (the light-transmitting resin 4) has an increased size.

Next, an illumination device according to another modified example of the foregoing embodiment will be described with reference to FIGS. 8 to 10C. As shown in FIGS. 8 and 9A to 9C, the light-transmitting resin 4 employed in this modified example has a rectangular parallelepiped shape. The light-transmitting resin 4 is formed into a substantially rectangular shape such that two opposing surfaces (a top surface 43 and a bottom surface 45) thereof have a substantially square shape and such that four surfaces thereof, i.e., a front surface 41, a pair of side surfaces 44, and a rear surface 42, which interconnect the top surface 43 and the bottom surface 45, have short sides intersecting the top surface 43 and the bottom surface 45.

As shown, the light-emitting element 2 is held by the light-transmitting resin 4 substantially at the center of the light-transmitting resin 4 in the width direction of the light-transmitting resin 4 and in a position nearer to the top surface 43 than to the bottom surface 45 in the height direction of the light-transmitting resin 4. The light-emitting element 2 is inclined at a specified angle with respect to the front surface 41 defining the appearance of the light-transmitting resin 4. In this modified example, the emission surface of the light-emitting element 2 is inclined to face downward.

The light-transmitting resin 4 includes a light distribution control surface 46 arranged on the front surface 41 to control the distribution of the light projected from the outer surface of the light-transmitting resin 4. The light distribution control surface 46 includes a recess portion 46a depressed into the front surface 41 of the light-transmitting resin 4 and a lens portion 46b facing the emission surface of the light-emitting element 2. The lens portion 46b is a convex lens curving outward towards the light emission direction of the light-emitting element 2.

Figure 10A:
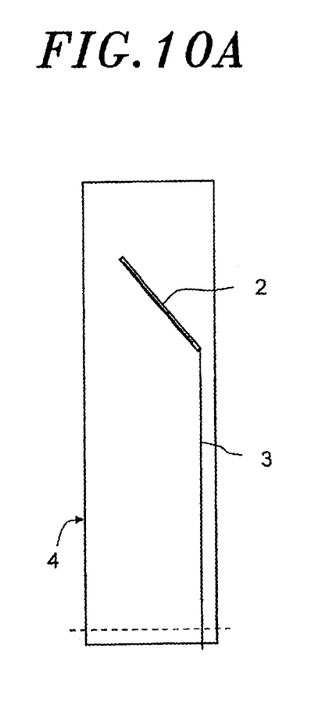
FIGS. 10A to 10C are side views for explaining a manufacturing sequence of the illumination device shown in FIG. 8.
Figure 10B:
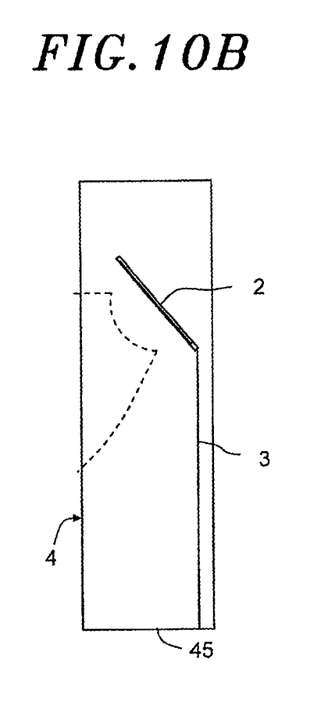
Figure 10C:
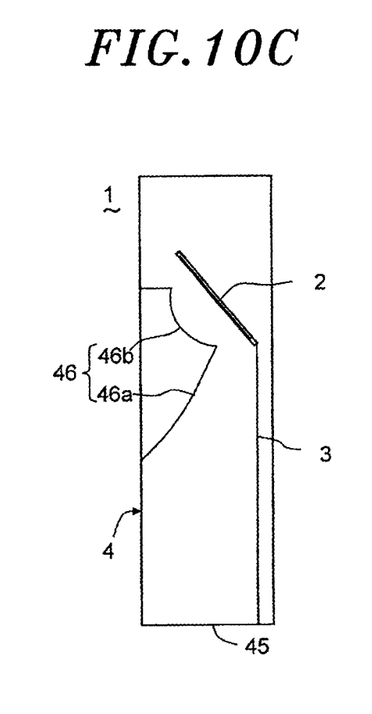
Figure 11A:
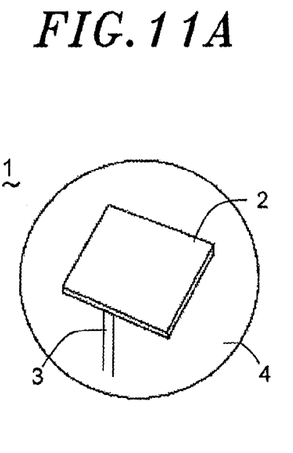
FIGS. 11A, 11B, 11C, 11D, and 11E are respectively perspective, plan, front, side, and rear views of an illumination device according to a further modified example of the embodiment.
Figure 11B:
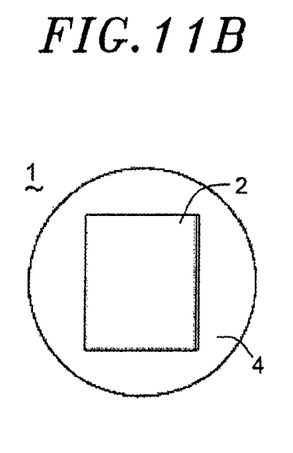
Figure 11C:
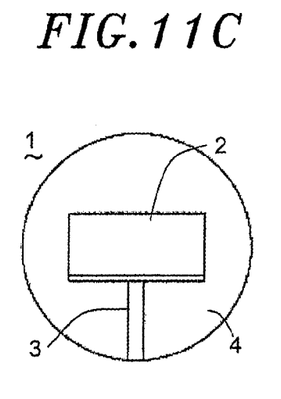
Figure 11D:
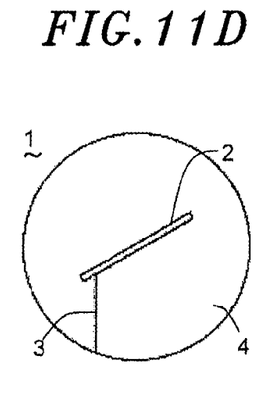
Figure 11E:
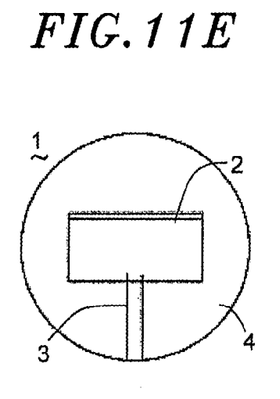
Figure 12A:
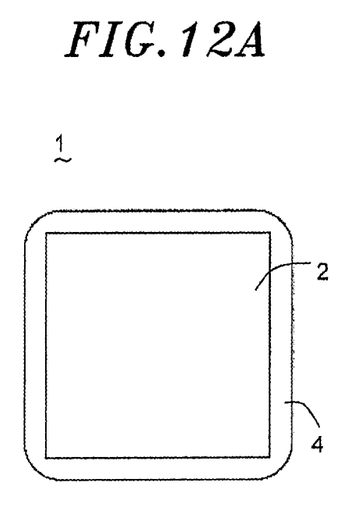
FIGS. 12A, 12B, 12C, and 12D are respective top, front, side, and rear views of an illumination device according to a still further modified example of the embodiment.
Figure 12B:
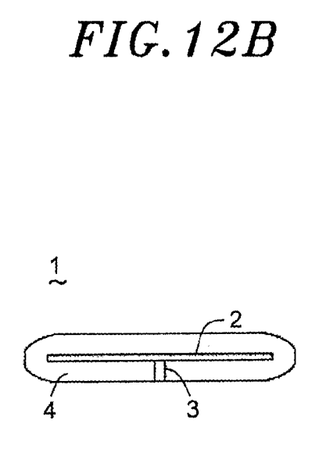
Figure 12C:
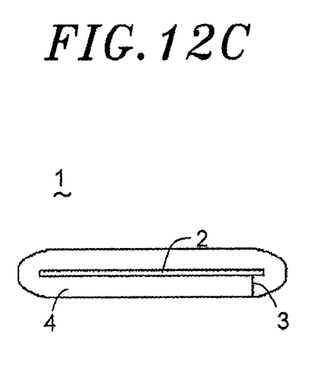
Figure 12D:
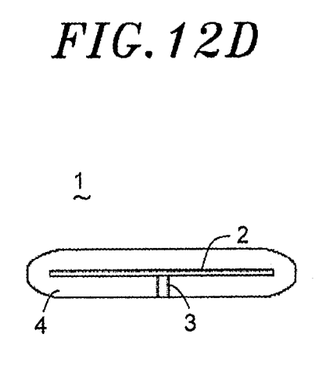
Figure 13A:
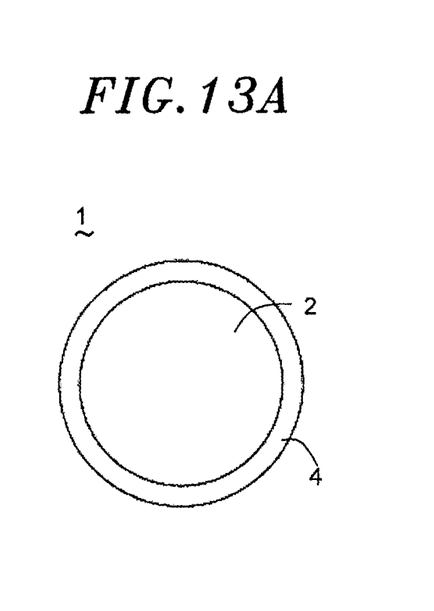
FIGS. 13A, 13B, 13C, and 13D are respectively top, front, side, and rear views of an illumination device according to a yet still further modified example of the embodiment.
Figure 13B:
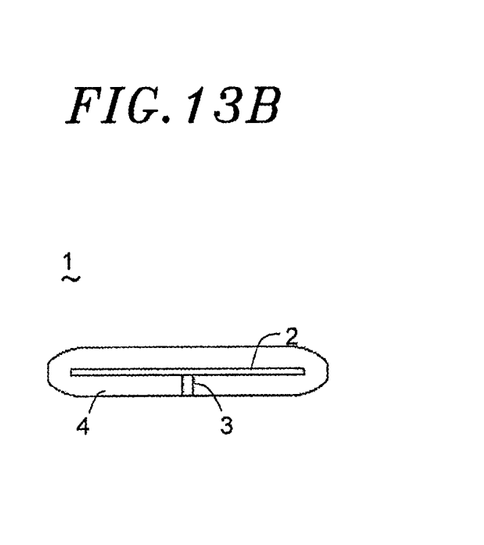
Figure 13C:
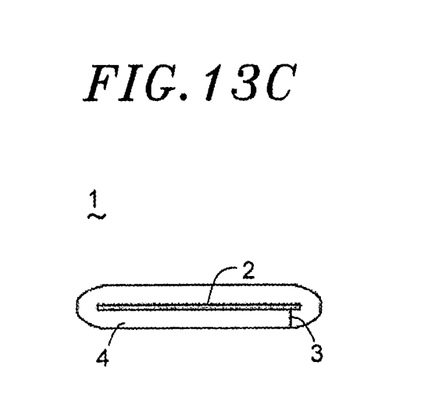
Figure 13D:
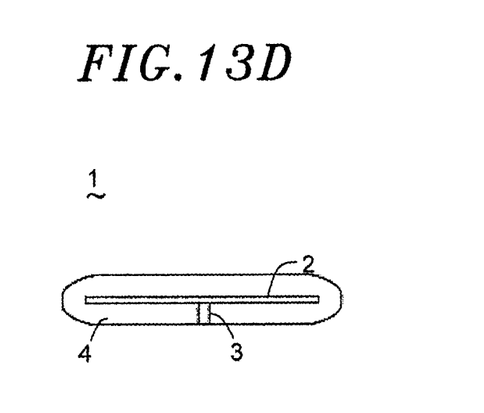

The manufacturing sequence of the illumination device 1 according to the present modified example will be described with reference to FIGS. 10A to 10C. In the manufacturing sequence of the illumination device 1 according to the present modified example, the holding step of the light-emitting element 2 and the wires 3 in the light-transmitting resin 4 remains the same as the step of the foregoing embodiment. In the present modified example, as shown in FIG. 10A, the light-transmitting resin 4 is formed in advance so as to have a height larger than the height of the illumination device 1 at the final manufacturing stage. Then, as shown in FIG. 10B, the end portions of the wires 3 and the lower portion of the light-transmitting resin 4 are cut away to thereby form the bottom surface 45. Just like the foregoing embodiment, this makes it possible to increase the sealing performance and to expose the wires 3. The cut surface (the bottom surface 45) becomes a frost surface. Therefore, even if the lead wires are connected to the ends of the wires 3, the lead wires are hardly visible from the front surface 41 or the side surfaces 44. This makes it possible to enhance the appearance of the illumination device 1.

Figure 8:
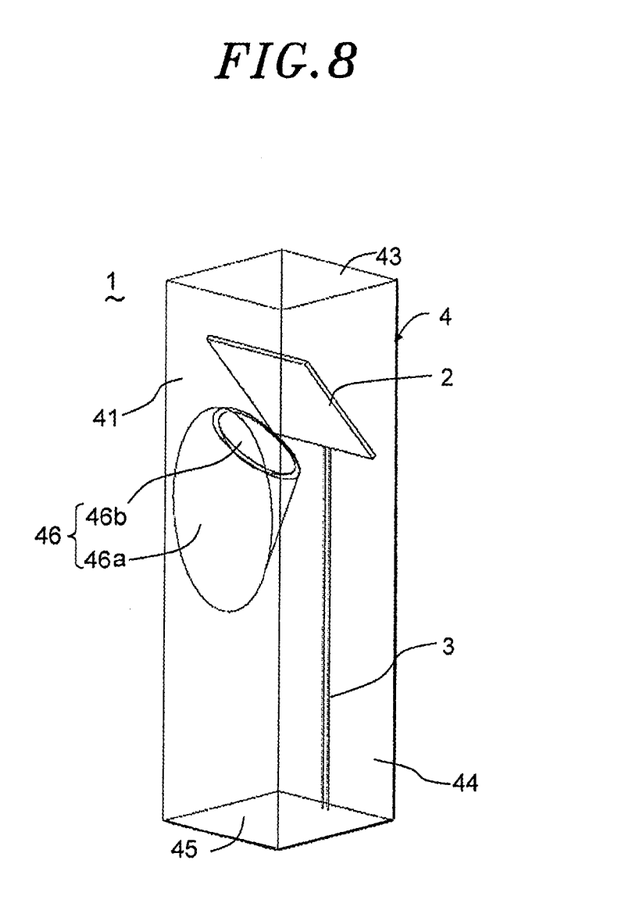
FIG. 8 is a perspective view of an illumination device according to another modified example of the embodiment.
Figure 9A:
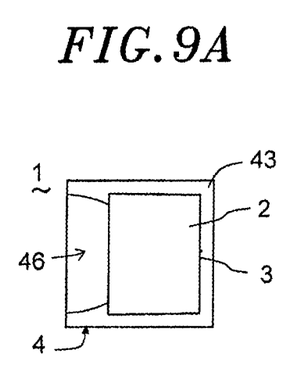
FIGS. 9A, 9B, and 9C are respectively plan, side, and front views of the illumination device shown in FIG. 8.
Figure 9B:
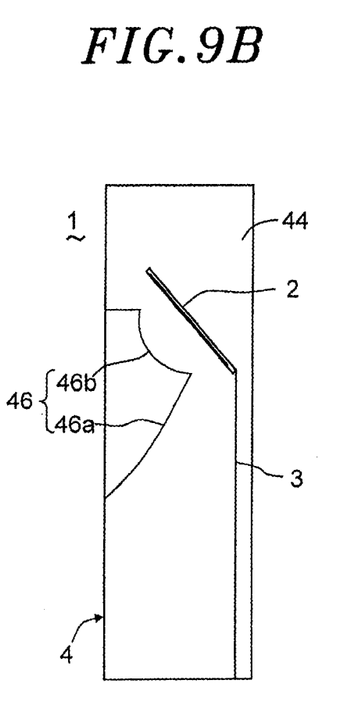
Figure 9C:
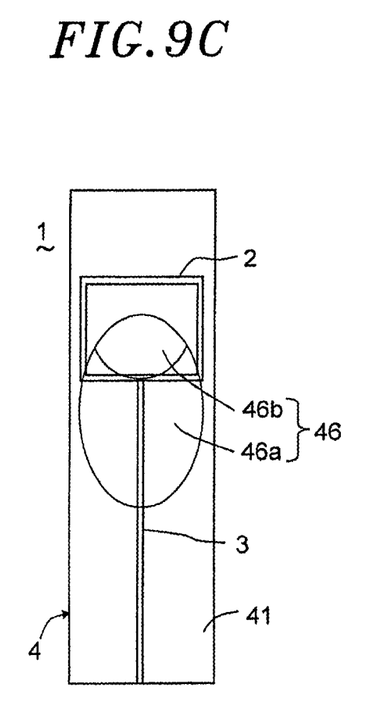

With the present modified example, the light distribution control surface 46 collects the light emitted from the emission surface of the light-emitting element 2 and irradiates the light on a specified region of a surface on which the illumination device 1 is placed. Thus, the illumination device 1 can be used as a task lamp.

There are many different variations in the shape of the light-transmitting resin 4. Illumination devices according to these variations will be described with reference to FIGS. 11A to 13D. Three modified examples will be illustrated herein. In the modified example shown in FIGS. 11A to 11E, the light-transmitting resin 4 is formed into a substantially spherical shape. In the illumination device 1 of the present modified example, the light-emitting element 2 is held by the light-transmitting resin 4 in a state in which the emission surface of the light-emitting element 2 faces obliquely upward. A base (not shown) is provided at the power-supply ends of the wires 3. A circuit board for lighting the light-emitting element 2 is accommodated within the base. In the modified example shown in FIGS. 12A to 12D, the light-transmitting resin 4 is formed into a flat box shape. The respective corner portions of the light-transmitting resin 4 are rounded. The light-emitting element 2 is arranged parallel to the ground surface. In the modified example shown in FIGS. 13A to 13D, the top surface of the light-transmitting resin 4, employed in the modified example shown in FIGS. 12A to 12D, is transformed into a circular shape. The rounded shape of the illumination devices 1 according to these modified examples can be desirably used as interior lighting that gives off the feeling of warmth.

The present invention is not limited to the embodiment and the modified examples described above but may be modified in many different forms. In the embodiment and the modified examples described above, all the light-transmitting resins 4 have a parallelepiped shape. Alternatively, the light-transmitting resins 4 may have a tetrahedral shape or a polyhedral shape having more than six surfaces. Moreover, the light-transmitting resins 4 may have a spherical external form or a hemispherical external form. In the configuration shown in FIG. 1, the frost processing may be performed not only on the top surface 43 but also on a portion of the front surface 41 or the rear surface 42. At this time, a diagram or a letter may be inscribed to the portions subjected to the frost processing. In this case, the light is radiated from the portions subjected to the frost processing. Thus, the decorativeness of the illumination device 1 is further increased. A dye or a fluorescent material may be added to the transparent material making up the light-transmitting resin 4.

While the invention has been shown and described with respect to the embodiments, it will be understood by those skilled in the art that various changes and modification may be made without departing from the scope of the invention as defined in the following claims.

What is claimed is:

1. An illumination device, comprising:
a light-emitting element;
a wire directly connected to the light-emitting element to supply electric power to the light-emitting element; and
a light-transmitting resin configured to hold the light-emitting element and the wire in one piece and having a cut corner portion,
wherein the light-transmitting resin defines an appearance of the illumination device, light emitted from the light-emitting element being transmitted through the light-transmitting resin to be radiated from an outer surface of the light-transmitting resin, and
wherein at least a portion of the wire directly connected to the light-emitting element is exposed from the cut corner portion of the light-transmitting resin.

2. The device of claim 1, wherein a portion of the outer surface of the light-transmitting resin is subjected to frost processing.

3. The device of claim 1, wherein the light-transmitting resin includes a light distribution control surface for controlling distribution of the light projected from the outer surface of the light-transmitting resin.

4. The device of claim 1, wherein the light-transmitting resin has a substantially spherical shape.

5. The device of claim 1, wherein the light-emitting element includes a plurality of light-emitting elements.

6. The device of claim 1, wherein the light-emitting element is a planar organic electroluminescence element that includes an organic layer including an organic emission layer, an anode layer provided on one surface of the organic layer, a cathode layer provided on the other surface of the organic layer, and a substrate on which the organic layer, the anode layer, and the cathode layer are deposited one above another.

7. The device of claim 6, wherein the anode layer and the cathode layer have a light-transmitting property.

8. The device of claim 1, wherein the light-transmitting resin has a substantially polyhedral shape, the light-emitting element having a flat shape and being held by the light-transmitting resin in a state where the light-emitting element remains parallel to one surface of the light-transmitting resin defining an appearance of the light-transmitting resin.

9. The device of claim 8, wherein the light-transmitting resin has rounded corner portions.

10. The device of claim 8, wherein the wire is held by the light-transmitting resin in a state in which a portion of the wire remains parallel to one side of the appearance of the light-transmitting resin.

11. The device of claim 1, wherein the light-transmitting resin has a substantially rectangular parallelepiped shape, the light-emitting element having a flat shape and being held by the light-transmitting resin in a state where the light-emitting element is inclined at a specified angle with respect to one surface of the light-transmitting resin defining the appearance of the light-transmitting resin.

12. The device of claim 11, wherein the light-transmitting resin has rounded corner portions.

13. The device of claim 11, wherein the wire is held by the light-transmitting resin in a state in which a portion of the wire remains parallel to one side of the appearance of the light-transmitting resin.

\* \* \* \* \*